(12) United States Patent
Mack

(10) Patent No.: US 7,594,197 B2
(45) Date of Patent: *Sep. 22, 2009

(54) SEMICONDUCTOR DEVICE HAVING PREDICTABLE ELECTRICAL PROPERTIES

(76) Inventor: Paul Mack, 25 Shipley Crescent, Stittsville, Ontario (CA) K2S 1R2

( * ) Notice: Subject to any disclaimer, the term of this patent is extended or adjusted under 35 U.S.C. 154(b) by 447 days.

This patent is subject to a terminal disclaimer.

(21) Appl. No.: 11/508,866

(22) Filed: Aug. 24, 2006

(65) Prior Publication Data

US 2006/0288316 A1  Dec. 21, 2006

Related U.S. Application Data

(63) Continuation-in-part of application No. 10/704,586, filed on Nov. 12, 2003, now Pat. No. 7,131,075.

(51) Int. Cl.
*G06F 17/50* (2006.01)
(52) U.S. Cl. ............................................. 716/1; 716/10
(58) Field of Classification Search ...................... 716/1, 716/2, 8–10, 4; 257/499, 528, 531–533, 257/536, 595; 703/2
See application file for complete search history.

(56) References Cited

U.S. PATENT DOCUMENTS

| | | | | |
|---|---|---|---|---|
| 6,347,393 | B1 * | 2/2002 | Alpert et al. | 716/2 |
| 6,519,748 | B2 * | 2/2003 | Sakamoto | 716/6 |
| 6,539,524 | B1 * | 3/2003 | Walden | 716/5 |
| 6,583,495 | B2 * | 6/2003 | Lee et al. | 257/595 |
| 6,732,068 | B2 * | 5/2004 | Sample et al. | 703/24 |
| 6,789,241 | B2 * | 9/2004 | Anderson et al. | 716/5 |
| 6,880,134 | B2 * | 4/2005 | Drennan | 716/2 |
| 7,003,741 | B2 * | 2/2006 | Srinivasan | 716/2 |

* cited by examiner

*Primary Examiner*—Vuthe Siek
(74) *Attorney, Agent, or Firm*—Gowling Lafleur Henderson LLP; Michael Crichton

(57) ABSTRACT

A circuit element of a semiconductor device is provided. The circuit element has an electrical property and is formed by at least two like individual elements, each of said individual elements having an individual electrical property, the individual electrical property of each individual element including an error portion that is substantially statistically uncorrelated with regard to the other individual elements wherein the electrical property is a function of a summation of the individual electrical properties.

21 Claims, 5 Drawing Sheets

SEMICONDUCTOR DEVICE HAVING PREDICTABLE ELECTRICAL PROPERTIES

FIELD OF INVENTION

This application is a continuation-in-part of U.S. patent application Ser. No. 10/704,586 filed Nov. 12, 2003, now U.S. Pat. No. 7,131,075. The instant invention relates to semiconductor devices having enhanced intrinsic precision properties that allow establishing a characteristic length in the sub- μm region.

In particular, the present invention relates to semiconductor devices and circuit elements thereof having more predictable electrical properties.

BACKGROUND OF THE INVENTION

One of the major goals in modern telecommunication is to achieve ever increasing transmission rates as well as data broadcast speeds, which is intimately coupled with the need of new and advanced technologies providing the necessary tools for accomplishing this quest. The demand for high precision in manufacturing semiconductor devices calls for the development of new manufacture tools and technologies, which is accompanied with a considerable amount of financial efforts. Thus, it would be advantageous to have at hand simple concepts which allow for the production of semiconductor devices with a characteristic length well below the μm region, but which do not require additional operating expenses.

Semiconductor devices and the systems that contain these devices therein are designed to provide a very particular performance and meet a particular design specification. The ability of the device to meet the designed specification relies on the ability of the manufacturing process to fabricate the devices.

For example, a given process is used to manufacture a batch of semiconductor devices. The devices are then tested and graded as per their ability to meet certain criteria. Those that meet the most stringent criteria will command the highest value. The value of the devices will then decrease with a corresponding decrease in their performance. This variable performance is an attribute of most semiconductor processing where predictability of the process is not always as high as is desired.

There is therefore a need for a semiconductor device structure that overcomes the unpredictable nature of fabrication processes and provides for more predictable device properties.

SUMMARY OF THE INVENTION

It is an object of the invention to provide an improved Semiconductor Device Having Predictable Electrical Properties.

According to an aspect of the present invention there is provided a circuit element of a semiconductor device, the circuit element having an electrical property and being formed by at least two like individual elements each of said individual elements having an individual electrical property, the individual electrical property of each individual element including an error portion that is substantially statistically uncorrelated with regard to the other individual elements wherein the electrical property is a function of a summation of the individual electrical properties.

According to another aspect of the present invention there is provided a method of providing a design of a semiconductor device, the method comprising the steps of: providing a design of a circuit for inclusion within the semiconductor device, the circuit including at least one circuit element having an electrical property; forming the circuit element from a concatenation of a plurality of individual circuit elements each having an individual electrical property, the electrical property being a concatenation of the individual electrical properties; and providing an electronic design including the circuit element and having the individual circuit elements arranged such that any errors resulting from the manufacturing thereof are substantially uncorrelated one with another.

According to another aspect of the present invention there is provided a storage medium having instruction data stored therein for when executing by a processor resulting in performance of: providing a design of a circuit for inclusion within the semiconductor device, the circuit including at least one circuit element having an electrical property; forming the circuit element from a concatenation of a plurality of individual circuit elements each having an individual electrical property, the electrical property being a concatenation of the individual electrical properties; and providing an electronic design including the circuit element and having the individual circuit elements arranged such that any errors resulting from the manufacturing thereof being substantially other than correlated one with another.

According to another aspect of the present invention there is provided a semiconductor device comprising: a circuit element having a given value of a characteristic property and comprising: at least two individual elements, each having an individual value for the characteristic value thereof, the individual values including an error portion that is substantially statistically uncorrelated, the individual elements disposed solely for contributing to the values of the characteristic property.

According to another aspect of the present invention there is provided a method of providing a design of a semiconductor device comprising: providing a design of a circuit for inclusion within the semiconductor device, the circuit including a high precision circuit element having a first characteristic value; forming the high precision circuit element from a plurality of individual circuit elements having characteristic values other than the first characteristic value arranged for providing a concatenated circuit element having the first characteristic value; and, providing an electronic design including the concatenated circuit element and having the individual circuit elements arranged for resulting in errors in the manufacturing thereof, the errors being substantially other than correlated one with another.

According to another aspect of the present invention there is provided a storage medium having instruction data stored therein for when executing by a processor resulting in performance of: providing a design of a circuit for inclusion within the semiconductor device, the circuit including a high precision circuit element having a first characteristic value; forming the high precision circuit element from a plurality of individual circuit elements having characteristic values other than the first characteristic value arranged for providing a concatenated circuit element having the first characteristic value; and, providing an electronic design including the concatenated circuit element and having the individual circuit elements arranged for resulting in errors in the manufacturing thereof the errors being substantially other than correlated one with another.

This summary of the invention does not necessarily describe all features of the invention.

BRIEF DESCRIPTION OF THE DRAWINGS

These and other features of the invention will become more apparent from the following description in which reference is made to the appended drawings wherein:

FIG. 1b shows the physical structure of a component of the semiconductor device of FIG. 1a;

FIG. 2b shows an embodiment of the physical structure of the components of the semiconductor device of FIG. 2a;

FIG. 2c shows another embodiment of the physical structure of the components of the semiconductor device of FIG. 2a;

DETAILED DESCRIPTION OF THE EMBODIMENTS

Figure 1A:
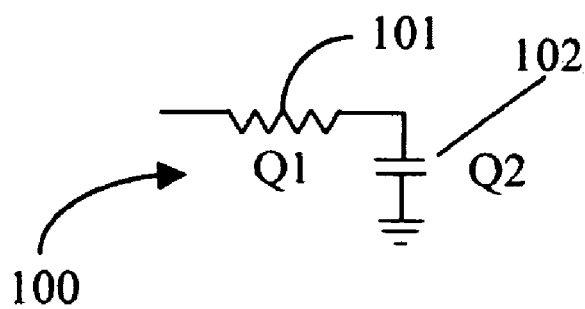
FIG. 1a shows part of a prior art conventional semiconductor device.

FIG. 1a presents a schematic diagram of a prior art semiconductor device structure 100. The device 100 comprises individual circuit components designated as $Q_1$ 101 and $Q_2$ 102, where the component 101 is a resistor and the component 102 is a capacitor. The components 101 and 102 and their arrangement shown in FIG. 1a are simply illustrative. A variety of different elements, such as resistors, capacitors, transistors, diodes, and the like may be elements of the circuit shown in FIG. 1a. The semiconductor device structure 100 will generally be manufactured using standard semiconductor manufacturing processes. In general, these processes will employ a plurality of deposition, masking and etching steps as will be apparent to one skilled in the art.

Generally, the component 101, i.e., $Q_n$, is a resistor that possesses characteristic dimensions, which are, for the resistor, characteristic length $L_n$, characteristic width $W_n$, and characteristic height $H_n$. The characteristic length $L_n$ of the element extends in a direction substantially parallel to the current flow through the element $Q_n$, and direction of characteristic width $W_n$ together with the direction of characteristic length $L_n$ define a set of vectors that span a two-dimensional plane perpendicular to the direction of current flow within the element $Q_n$, of the semiconductor device 100.

Figure 1B:
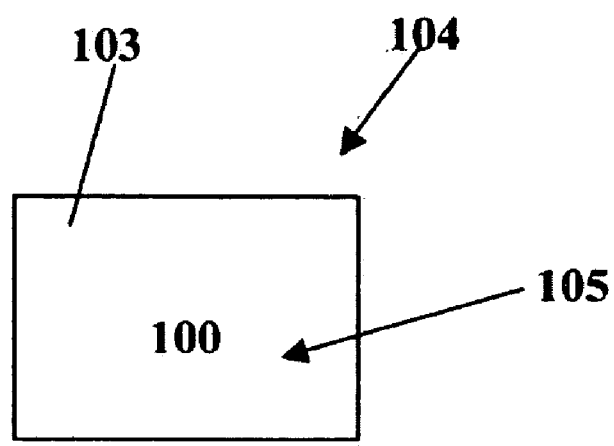

FIG. 1b schematically presents the physical structure of the component 102. The component 102 is a capacitor. As Such it will be apparent to one of skill in the art that the structure of component 102 will include a dielectric layer 103 that separates two layers of conductor 104 and 105 that are on either side of the dielectric 103. The dimensions of these layers will be determined by the required capacitance for the component 102. For illustrative purposes the capacitor 102 has a capacitance of 100 pF (as shown).

Characteristic properties of the capacitor 102 are governed by the properties of the materials from which it is formed and the physical dimensions of the structures produced from these materials. The capacitance of component 102 is designated as $\Theta_n$ in Equation (1):

$$\Theta_n = \frac{\varepsilon}{L_n} \qquad (1)$$

where $\in$ is the dielectric constant of the dielectric layer 103 and $L_n$ is its thickness, which in turn is the separation between the conductors 104 and 105.

Associated with each characteristic property, including the capacitance of capacitor 102, i.e., $\Theta_n$, is a certain error $\Delta\Theta_n$, defining the variance of the actual value of the characteristic property vs. the value that was designed. Similar to equation (1), the error $\Delta\Theta_n$ is expressed as a function of the errors associated with the individual components as shown in Equation (2):

$$\Delta\Theta_n = f(\Delta\in, \Delta L_n) \qquad (2)$$

In order to achieve a certain and predictable design specification for $\Theta_n$ a very tight tolerance for $\Delta\Theta_n$ is required. Meeting the error requirements for the designed properties often implies very tight control of the fabrication process or selective grading of manufactured devices with regard to their actual performance.

It will be apparent to one skilled in the art that other circuit elements will have characteristic properties including, but not limited to resistance and inductance, and so forth.

Figure 2A:
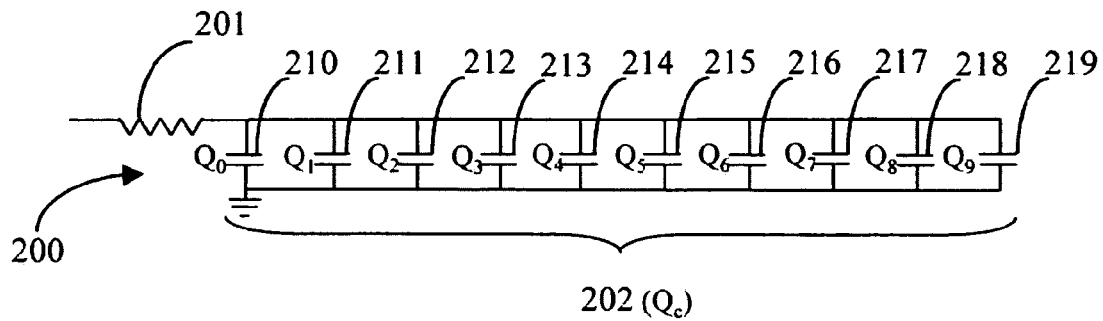
FIG. 2a shows an embodiment of part of a semiconductor device.

FIG. 2a presents a schematic diagram of a semiconductor circuit 200 that contains a semiconductor circuit element according to an embodiment of the present invention. The semiconductor device according to the present invention is manufactured using known technologies and in similar fashion as described herein. The semiconductor circuit 200 comprises a resistor 201 and a concatenated element $Q_c$ forming a capacitor 202. The capacitor 202 comprises ten individual capacitors or individual circuit elements $Q_0$ 210 to $Q_9$ 219, respectively. Referring to FIG. 2a, these elements are connected in parallel. Other arrangements and other circuit elements are easily envisioned, in which for example the elements $Q_0$ 210 to $Q_9$ 219 are connected in series.

Figure 2B:
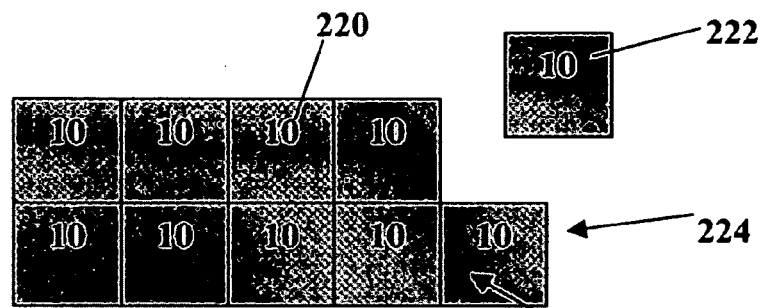

FIG. 2b schematically presents the physical structure of the capacitor 202. As such, it will be apparent to one of skill in the art that the structure of component 202 will include a dielectric layer 220 that separates two layers of conductor 224 and 226 that are on either side of the dielectric 220. The dimensions of these layers will be determined by the required capacitance for the capacitor 202. For illustrative purposes, the capacitor 202 of FIG. 2b has a capacitance of 100 pF.

In FIG. 2b it is illustrated, for exemplary purposes, that the dielectric 220 comprises 10 individual elements, such as element 222, each having a capacitance of 10 pF. In this example the overall capacitance is therefore a summation of the capacitances of the ten individual capacitors 210 to 219, respectively.

The principle of the instant invention is now illustrated for a capacitor with capacitance C comprising ten individual capacitors with capacitances $C_0$ to $C_9$, respectively, the ten capacitors connected in parallel. A person of skill in the art with ease extends this example to other representative elements as well.

The capacitance C of a capacitor on a semiconductor device is basically expressed by equation (3):

$$C = \varepsilon_0 \cdot \varepsilon_r \cdot \frac{W}{H} \cdot L \quad (3)$$

In equation (3), $\varepsilon_0$ is the dielectric constant in vacuo, and $\varepsilon_r$ a material dependent dielectric constant of the semiconductor device. Assuming that the ten individual capacitors have constant height and constant width, and combining the constant values of W, H, $\varepsilon_0$ and $\varepsilon_r$ into a new constant k, one obtains:

$$C = k \cdot L \quad (4)$$

Since the ten individual capacitors are connected in parallel, one obtains the following relation between capacitance and individual lengths:

$$C = \sum_{n=0}^{9} C_n = \kappa \cdot \sum_{n=0}^{9} L_n \quad (5)$$

Equation (5) in view of equation (3) suggests that the capacitance C is directly related to the capacitance of the individual capacitors. If the ten individual capacitors are manufactured in a statistically correlated fashion, that is if they are manufactured within the same process, the precision in capacitance $\Delta C$ is a sum of the absolute values of fabrication precision:

$$\Delta C = \sum_{n=0}^{9} |\Delta L_n| = 10\delta \quad (6)$$

In equation (6), $\delta$ represents an absolute value of a fabrication precision $\Delta L_n$. In case that the ten individual capacitors are not manufactured with a same process, their individual errors are truly uncorrelated, and one obtains:

$$\Delta C = \sum_{n=0}^{9} \pm \Delta L_n \quad (7)$$

According to the instant invention, the semiconductor device is manufactured in a way that the individual elements constituting a given element $Q_n$ are manufactured independently, and are therefore not statistically correlated. Thus, the fabrication precision $\Delta L_n$ is different for all individual elements, possibly not only in magnitude, but also in sign. This allows for error cancellation resulting in a concatenated element $Q_c$ with a higher precision in its characteristic property than a single element Q having essentially the same value for $\Theta$.

Statistical correlation is avoidable through numerous methods. One of skill in the art will appreciate that differing levels of statistical decorrelation result in improved or reduced benefit of the inventive method disclosed herein.

Figure 2C:
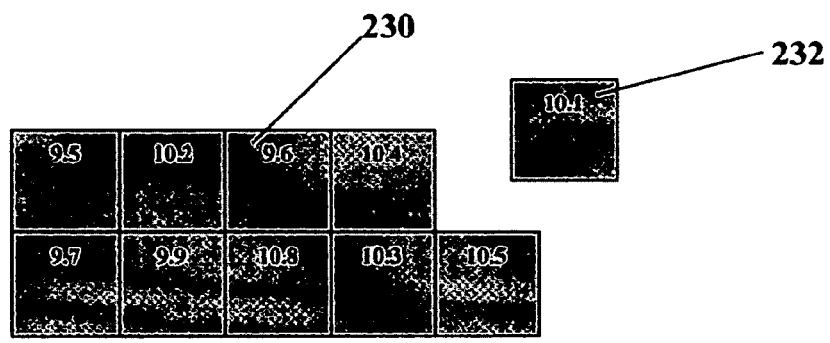

FIG. 2c schematically presents another embodiment of the physical structure of the capacitor 202. In FIG. 2c it is illustrated, for exemplary purposes, that the dielectric layer 230 comprises 10 individual elements, such as element 232. The individual elements of FIG. 2c have individual capacitances according to an embodiment of the present invention. Namely, the individual capacitances have individual values that are within a certain error of 10 pF where this error between a particular capacitance and 10 pF is statistically uncorrelated with regard to the error of the other individual elements. As in the case of FIG. 2b, the overall capacitance of capacitor 202 of FIG. 2c is therefore a summation of the capacitances of the ten individual capacitors 210 to 219, respectively.

Table 1 below illustrates some exemplary calculations according to an embodiment of the present invention (i.e., ten individual capacitances) in contrast with an embodiment according to a prior art approach (i.e., one 100 pF capacitor). Using the exemplary capacitance values from the physical structure described above and shown in FIG. 2c, it is readily apparent in Table 1 that the individual capacitances have individual values that are within a certain error of 10 pF where this error between a particular capacitance and 10 pF is statistically uncorrelated with regard to the error of the other individual elements. As in the case of FIGS. 2b and 2c, the overall capacitance of the Table 1 capacitor representing an embodiment of the present invention is a summation of the capacitances of the values of the ten individual capacitors.

TABLE 1

Exemplary calculations according to an embodiment of the present invention

|  | VALUES | QTY | INDIVIDUAL ERROR | ACCUMULATIVE ERROR | ERROR^3 | POTENTIAL YIELD INCREASE |
|---|---|---|---|---|---|---|
|  | 100 | 1 | 5.00 | 5 |  |  |
| RMS | 10 | 10 | 0.50 | 1.58 |  | 316.23% |
| R^3M^3 | 9.5 |  | 0.48 | 1.120 | 0.107171875000 | 446.48% |
|  | 10.2 |  | 0.51 |  | 0.132651000000 |  |
|  | 9.6 |  | 0.48 |  | 0.110592000000 |  |
|  | 10.4 |  | 0.52 |  | 0.140608000000 |  |
|  | 10.1 |  | 0.51 |  | 0.128787625000 |  |
|  | 9.7 |  | 0.49 |  | 0.114084125000 |  |
|  | 9.9 |  | 0.50 |  | 0.121287375000 |  |

TABLE 1-continued

Exemplary calculations according to an embodiment of the present invention

| | VALUES | QTY | INDIVIDUAL ERROR | ACCUMULATIVE ERROR | ERROR^3 | POTENTIAL YIELD INCREASE |
|---|---|---|---|---|---|---|
| | 9.8 | | 0.49 | | 0.117649000000 | |
| | 10.3 | | 0.52 | | 0.136590875000 | |
| | 10.5 | | 0.53 | | 0.144703125000 | |
| TOTAL | | 100 | | | 1.25412500 | |
| | | | BASIC COMPONENT ERROR = +/−5% | | | |

Figure 3A:
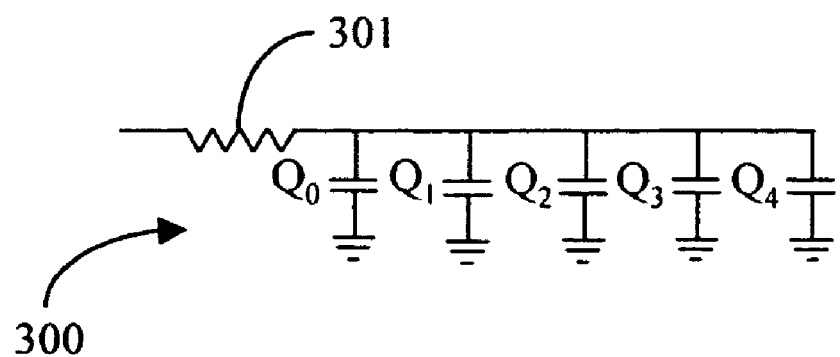
FIG. 3a shows an embodiment of part of a semiconductor device.

The relationship of the capacitances of the individual elements is further illustrated with regard to FIG. 3a. FIG. 3a presents a schematic for a semiconductor circuit element 300 according to the present invention wherein the individual elements constituting a given element $Q_n$ are specified distinctly and are therefore not statistically correlated. Here, each individual element has a different characteristic value differing from the others by an amount selected to be statistically distinct. For example, as shown, by selecting lengths of the capacitive elements that vary in small amounts but result in capacitances that sum to the overall desired capacitance, a further correlation between individual elements is eliminated. For example, when the capacitances are 10.02, 9.83, 10.08, 10.11 and 9.96, the error within each capacitance value is substantially uncorrelated as the errors relating to process vary due to the small variations in individual capacitor sizes. If the capacitive elements are also manufactured according to a different process—disposed on different layers or manufactured differently—then two types of decorrelation between individual errors result. Increasing the types of decorrelation acts to increase the convolution of error functions resulting in a larger proportion of errors being grouped about the desired value and fewer errors being distant therefrom (convolution of two peaks results in a sharper peak as shown in FIG. 3b).

Figure 3B:
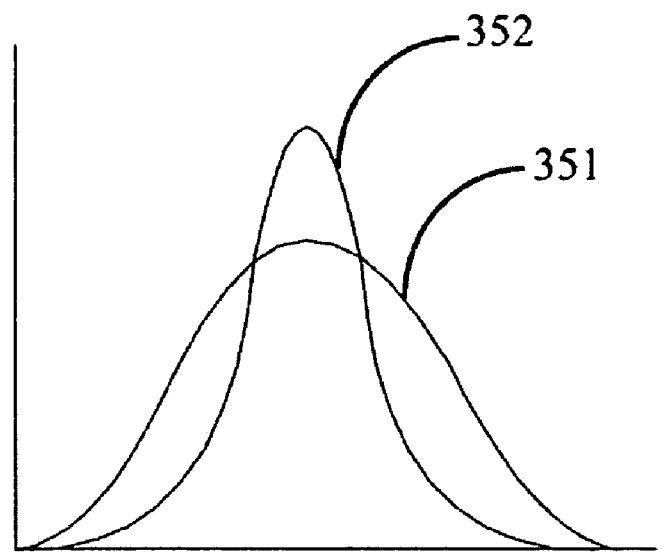
FIG. 3b shows a simplified graphical diagram of error distribution within a manufacturing process.

Referring to FIG. 3b, a graph is shown having two curves. The curve 351 is a statistical distribution of random error for manufacturing of a single element. When two elements forming a concatenated element are manufactured with statistically uncorrelated processes, the resulting error distribution has a sharper peak thereby reducing the number of resulting concatenated elements falling outside a given accuracy. Though this is the case, the maximum error value resulting from the manufacturing process remains unchanged. Greater number of elements forming the concatenated element and each formed such that the error in the manufacture thereof is uncorrelated with the error within the manufacture of the other elements results in an even sharper peak and therefore in a tighter grouping of the concatenated element about a designated value.

As the level of correlation between individual elements is reduced, the portion of the manufacturing error that is able to cancel with other errors becomes increased for the set of individual elements. Thus, the level or percentage of repeatability in manufacture is enhanced through the present process. The present method allows for a tighter grouping of errors about a near zero error value therefore increasing yield or, for high precision components, manufacturability.

The capacitance of the individual elements may be considered as the total capacitance divided by the number of individual elements offset by a small but significant amount. Statistics may determine significance. The sum of all capacitors in FIG. 2c is the capacitance C, while each individual capacitor is slightly different.

Figure 4:
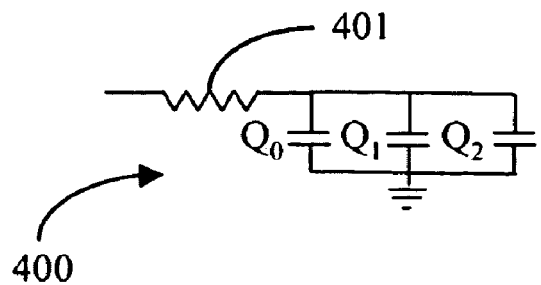
FIG. 4 shows an embodiment of part of a semiconductor device.

Referring to FIG. 4, a semiconductor device according to the invention is shown wherein the individual elements constituting a given element $Q_n$ are specified distinctly and formed within different manufacturing steps. Here, each individual element has a different characteristic value differing from the others by an amount selected to be statistically distinct, for example 10.00, 10.40, and 9.60, and each individual element is disposed on a different layer or formed by a separate process, for example, using different dielectrics. As such, the level of correlation between individual elements is reduced both in dimension and in manufacturing resulting in the portion of the manufacturing error that is uncorrelated becoming increased for the set of individual elements. Conversely, correlated errors typically sum similarly for each additional element. Thus, when error is highly correlated, the resulting peak is similar regardless of the number of elements.

Figure 5:
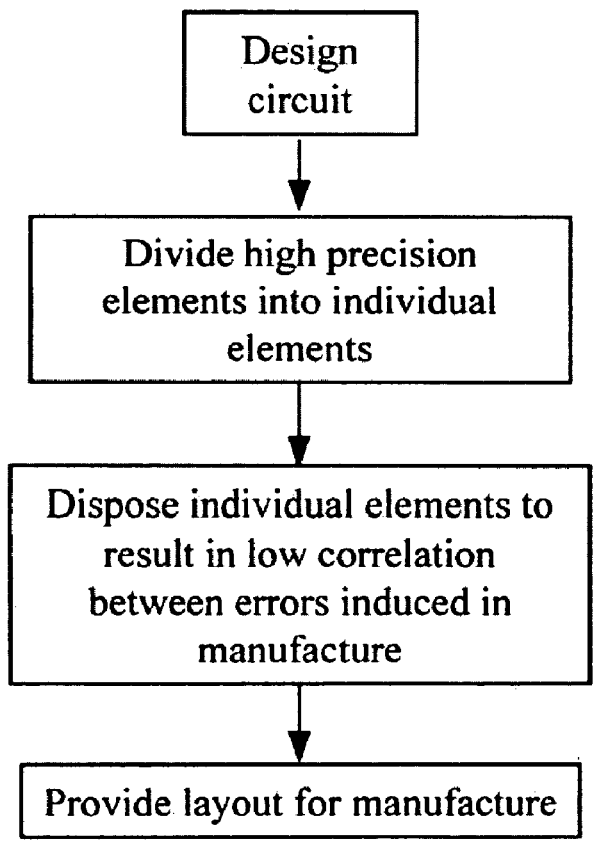
FIG. 5 shows a simplified flow diagram of a method according to the present invention.

Referring to FIG. 5, a flow diagram of a method according to the invention is shown. A circuit is designed and provided for layout. In the layout process, circuit elements requiring high precision are identified and are then divided into a plurality of individual elements, the plurality of individual elements having a same characteristic as the identified circuit element requiring high precision. The individual elements are disposed within the layout in a manner to provide for a statistical decorrelation between manufacturing errors anticipated to occur for each individual element. Preferably, the statistical decorrelation is sufficient to improve the efficiency to or above the required high precision. The layout, is then provided for manufacture and, during manufacture testing is performed to ensure that the increase in parts meeting or exceeding the required high precision is achieved.

It is well known to those of skill in the art that the method of FIG. 5 may be implemented manually or by an automated software process. Further, the process may be implemented during design by the designer or by the software tools used during design. Of course implementing of the method during design in an automated fashion allows for simulation of the design as implemented providing increased testing abilities.

Decorrelation between errors induced in manufacture of individual elements is determinable through experimentation or through reasonable prediction. For example, elements formed by distinct processes, formed on different layers or with different masks, formed of different compositions, having distinct values. etc., typically result in smaller correlation between manufacturing errors therebetween. Of course, this may not always be the case.

Figure 6:
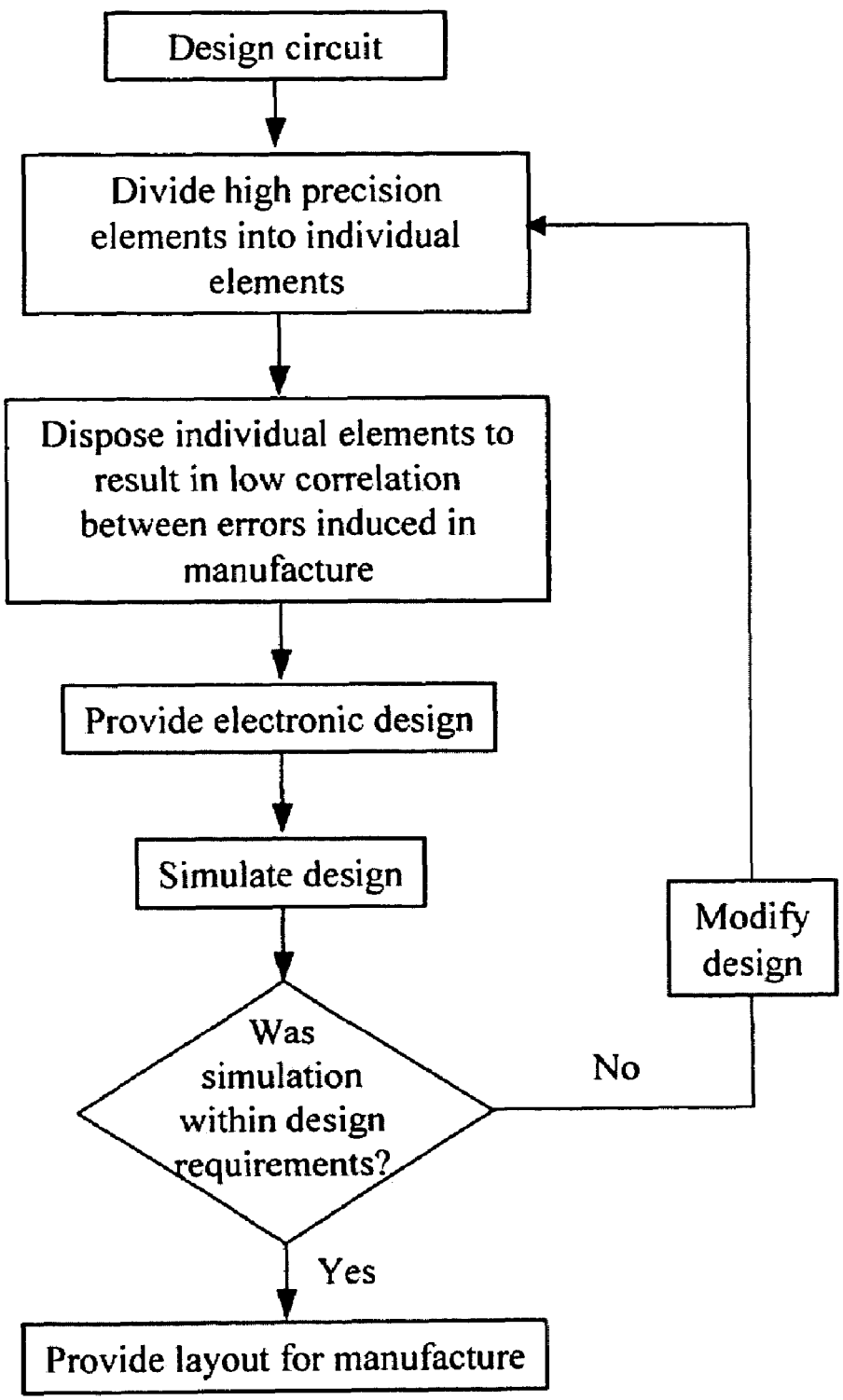
FIG. 6 shows a simplified flow diagram of a method according to the present invention.

Referring to FIG. 6, a flow diagram of a method according to the invention is shown. A circuit is designed and provided for layout. In the layout process, circuit elements requiring high precision are identified and are then divided into a plurality of individual elements, the plurality of individual elements having a same characteristic as the identified circuit element requiring high precision. The individual elements are disposed within the layout in a manner to provide for a statistical decorrelation between manufacturing errors anticipated to occur for each individual element. Preferably, the statistical decorrelation is sufficient to improve the efficiency to or above the required high precision. The layout is then provided for simulation. Upon completion of the simulation, the design is modified as necessary and then the process is iterated until the design requirements are met. The layout is then provided for manufacture and during manufacture testing is performed to ensure that the increase in parts meeting or exceeding the required high precision is achieved.

The present invention has been described with regard to one or more embodiments. However, it will be apparent to persons skilled in the art that a number of variations and modifications can be made without departing from the scope of the invention as defined in the claims.

What is claimed is:

1. A circuit element of a semiconductor device, the circuit element having an electrical property value and being formed by at least two like individual elements, each of said individual elements having an individual electrical property value, the individual electrical property value of each individual element including an error portion that is substantially statistically uncorrelated with regard to the other individual elements wherein the electrical property value of the circuit element is a function of a summation of the electrical property values of the individual elements, wherein there is a difference in the electrical property value of the at least two individual elements of less than 10 percent.

2. The circuit element according to claim 1, wherein the circuit element is a member of the group consisting of resistors, capacitors and inductors.

3. The circuit element according to claim 1 wherein there are more than 5 individual elements forming the circuit element.

4. The circuit element according to claim 1 wherein at least one of the individual elements forming the circuit element is formed with a different manufacturing process.

5. The circuit element according to claim 4 wherein at least one of the individual elements forming the circuit element includes a different material.

6. The circuit element according to claim 1 wherein at least one of the individual elements forming the circuit element is doped differently.

7. The circuit element according to claim 1 wherein at least one of the individual elements forming the circuit element is formed with a same manufacturing process in a fashion that the manufacturing errors are uncorrelated therebetween.

8. The circuit element according to claim 7 wherein at least one of the individual elements forming the circuit element is doped differently.

9. The circuit element according to claim 8 wherein at least one of the individual elements forming the circuit element is disposed within a different layer of the semiconductor device.

10. The circuit element according to claim 1 wherein a substantial portion of any manufacturing errors associated with the formation of the individual elements is substantially uncorrelated in more than one dimension.

11. The circuit element according to claim 10 wherein a substantial portion of any manufacturing errors associated with the formation of the individual elements is substantially uncorrelated in more than two dimensions.

12. A method of manufacturing a semiconductor device designed according to a method of providing a design comprising the steps of:
   providing a design of a circuit for inclusion within the semiconductor device, the circuit including at least one circuit element having an electrical property value;
   forming the circuit element from a concatenation of a plurality of individual circuit elements each having an individual electrical property valve, the electrical property value of the circuit element being a concatenation of the electrical property values of the individual elements by a software executing on a computer processor; and
   providing an electronic design including the circuit element and having the individual circuit elements arranged such that any errors resulting from the manufacturing thereof are substantially uncorrelated one with another,
wherein the difference between the electrical property value of the individual elements is less than 10 percent.

13. The method according to claim 12 comprising the steps of:
   simulating the electronic design; and
   amending one of the electronic design and design of a circuit.

14. The method according to claim 12 further comprising the steps of:
   (i) simulating the electronic design; and
   (ii) amending one of the electronic design and design of a circuit,
   wherein the steps (i) and (ii) are iterated until the simulated electronic design meets predetermined design criteria.

15. The method according to claim 12 wherein there are more than 5 individual elements.

16. The method according to claim 12 wherein at least one of the individual elements forming the circuit element are formed with different manufacturing processes.

17. The method, according to claim 12 wherein at least one of the individual elements forming the circuit element is doped differently.

18. The method according to claim 12 wherein at least one of the individual elements forming the circuit element is formed using a manufacturing process in a fashion that the manufacturing errors are uncorrelated therebetween.

19. The method according to claim 12 wherein at least one of the individual elements forming the circuit element is disposed within different layers of the semiconductor device.

20. The method according to claim 12 wherein a substantial portion of any manufacturing errors associated with the individual elements forming the circuit element are substantially uncorrelated in more than one dimension.

21. The method according to claim 20 wherein a substantial portion of the manufacturing errors associated with the individual elements forming the circuit element are substantially uncorrelated in more than two dimensions.

* * * * *

UNITED STATES PATENT AND TRADEMARK OFFICE
CERTIFICATE OF CORRECTION

PATENT NO.       : 7,594,197 B2                              Page 1 of 1
APPLICATION NO.  : 11/508866
DATED            : September 22, 2009
INVENTOR(S)      : Paul Mack It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 476 days.

Signed and Sealed this

Twenty-eighth Day of September, 2010

David J. Kappos
*Director of the United States Patent and Trademark Office*